(12) United States Patent
Zhao et al.

(10) Patent No.: US 10,685,615 B2
(45) Date of Patent: Jun. 16, 2020

(54) SHIFT REGISTER AND DRIVING METHOD THEREOF, GATE DRIVING CIRCUIT, AND DISPLAY DEVICE

(71) Applicants: BOE Technology Group Co., Ltd., Beijing (CN); Hefei Xinsheng Optoelectronics Technology Co., Ltd., Anhui (CN)

(72) Inventors: Jian Zhao, Beijing (CN); Huanyu Li, Beijing (CN); Xiuli Si, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 213 days.

(21) Appl. No.: 15/979,701

(22) Filed: May 15, 2018

(65) Prior Publication Data
US 2019/0080661 A1   Mar. 14, 2019

(30) Foreign Application Priority Data
Sep. 13, 2017   (CN) .......................... 2017 1 0821713

(51) Int. Cl.
*G11C 19/00*   (2006.01)
*G09G 3/36*   (2006.01)
*G11C 19/28*   (2006.01)

(52) U.S. Cl.
CPC ........... *G09G 3/3677* (2013.01); *G11C 19/28* (2013.01); *G09G 2310/0286* (2013.01);
(Continued)

(58) Field of Classification Search
None
See application file for complete search history.

(56) References Cited

U.S. PATENT DOCUMENTS

| 2012/0105405 A1 | 5/2012 | Hsiao et al. |
| 2014/0218346 A1 | 8/2014 | Huang |

(Continued)

FOREIGN PATENT DOCUMENTS

| CN | 1692398 A | 11/2005 |
| CN | 101763900 A | 6/2010 |

(Continued)

OTHER PUBLICATIONS

First Office Action dated Aug. 14, 2019 corresponding to Chinese application No. 201710821713.8.

*Primary Examiner* — Tuan T Lam
(74) *Attorney, Agent, or Firm* — Nath, Goldberg & Meyer; Joshua B. Goldberg

(57) ABSTRACT

The disclosure provides a shift register, a driving method for the shift register, a gate driving circuit and a display device. The shift register comprises an input component, a reset component, a node control module, a chamfering control component and an output component. By setting the chamfering control component and cooperation among the above five components, an amplitude of a scanning signal output by a driving signal output terminal is changed so as to generate a scanning signal with a chamfered waveform. When the scanning signal with the chamfered waveform is sequentially input to each pixel unit in a corresponding row by a corresponding gate line, a jump voltage $^{\Delta}Vp$ on a pixel electrode of the pixel unit can be reduced, thereby mitigating phenomena such as flashing and image sticking of the display panel and improving the display quality of the display panel.

20 Claims, 9 Drawing Sheets

(52) U.S. Cl.
CPC ..... *G09G 2310/06* (2013.01); *G09G 2310/08* (2013.01); *G09G 2320/0247* (2013.01); *G09G 2320/0257* (2013.01); *G09G 2330/02* (2013.01)

(56) References Cited

U.S. PATENT DOCUMENTS

| | | | |
|---|---|---|---|
| 2018/0268914 A1* | 9/2018 | Zhao | G11C 19/18 |
| 2019/0066617 A1* | 2/2019 | Zhao | G09G 3/3677 |
| 2019/0115090 A1* | 4/2019 | Tao | G11C 19/287 |

FOREIGN PATENT DOCUMENTS

| | | |
|---|---|---|
| CN | 102968969 A | 3/2013 |
| CN | 103177682 A | 6/2013 |
| CN | 103258514 A | 8/2013 |
| CN | 103680427 A | 3/2014 |
| CN | 105632563 A | 6/2016 |
| CN | 106057116 A | 10/2016 |
| CN | 106098101 A | 11/2016 |
| CN | 206370275 U | 8/2017 |

\* cited by examiner

SHIFT REGISTER AND DRIVING METHOD THEREOF, GATE DRIVING CIRCUIT, AND DISPLAY DEVICE

CROSS-REFERENCE TO RELATED APPLICATION

This disclosure claims the benefit of priority to the Chinese Patent Application No.201710821713.8 filed on Sep. 13, 2017, the contents of which are incorporated herein in their entirety by reference.

TECHNICAL FIELD

The present application relates to the field of display technology, and particularly to a shift register and a driving method thereof, a gate driving circuit and a display device.

BACKGROUND

With rapid development of the display technology, a display panel is developed towards high integration and low cost. In the gate driver on array (GOA) technology, a thin film transistor (TFT) gate switching circuit is integrated on an array substrate of a display panel to form a scanning driver for the display panel, which will save a wiring space for a bonding region and a fan-out region of a gate integrated circuit (IC), thus not only reducing the cost in material and manufacturing process, but also obtaining an aesthetic design of two symmetric sides and narrow bezel for the display panel. Moreover, such an integration design does not require the bonding process in the gate scanning direction, thus improving productivity and yield.

SUMMARY

Embodiments of the present disclosure provide a shift register, a driving method for the shift register, a gate driving circuit and a display device.

The shift register provided by an embodiment of the disclosure comprises an input component, a reset component, a node control component, a chamfering control component and an output component, the input component is electrically connected to an input signal terminal and a first node, to supply a signal at the input signal terminal to the first node under the control of the input signal terminal;

the reset component is electrically connected to a reset signal terminal, a reference voltage signal terminal and the first node, to supply a signal at the reference voltage signal terminal to the first node under the control of the reset signal terminal;

the node control component is electrically connected to the first node and a second node, to make a potential of a signal at the first node opposite to a potential of a signal at the second node;

the chamfering control component is electrically connected to a first clock signal terminal, a second clock signal terminal, a chamfering control signal terminal and a third node, to supply a signal at the first clock signal terminal to the third node under the control of the first clock signal terminal, and supply a signal at the second clock signal terminal to the third node under the control of the chamfering control signal terminal, and an amplitude of the signal at the second clock signal terminal is smaller than that of the signal at the first clock signal terminal; and the output component is electrically connected to the first node, the second node, the third node, a third clock signal terminal and a driving signal output terminal, to supply a signal at the third node to the driving signal output terminal of the shift register under the control of the signal at the first node and supply a signal at the reference voltage signal terminal to the driving signal output terminal under the control of the third clock signal terminal and the signal at the second node.

In some embodiments, the chamfering control component comprises a switching transistor and a second switching transistor;

a control electrode of the first switching transistor is electrically connected to the chamfering control signal terminal, a first electrode of the first switching transistor is electrically connected to the second clock signal terminal, and a second electrode of the first switching transistor is electrically connected to the third node; and both a control electrode and a first electrode of the second switching transistor are electrically connected to the first clock signal terminal, and a second electrode of the second switching transistor is electrically connected to the third node.

In some embodiments, the output component comprises a third switching transistor, a fourth switching transistor, a fifth switching transistor and a storage capacitor;

a control electrode of the third switching transistor is electrically connected to the first node, a first electrode of the third switching transistor is electrically connected to the third node, and a second electrode of the third switching transistor is electrically connected to the driving signal output terminal;

a control electrode of the fourth switching transistor is electrically connected to the second node, a first electrode of the fourth switching transistor is electrically connected to the reference voltage signal terminal, and a second electrode of the fourth switching transistor is electrically connected to the driving signal output terminal;

a control electrode of the fifth switching transistor is electrically connected to the third clock signal terminal, a first electrode of the fifth switching transistor is electrically connected to the reference voltage signal terminal, and a second electrode of the fifth switching transistor is electrically connected to the driving signal output terminal; and one terminal of the storage capacitor is electrically connected to the first node, and the other terminal of the storage capacitor is electrically connected to the driving signal output terminal.

In some embodiments, the node control component comprises a first node control sub-component and a second node control sub-component;

the first node control sub-component is electrically connected to the reference voltage signal terminal, the first node and the second node, to supply the signal at the reference voltage signal terminal to the first node under the control of the signal at the second node; and the second node control sub-component is electrically connected to the third clock signal terminal, the reference voltage signal terminal, the first node and the second node, to supply a signal at the third clock signal terminal to the second node under the control of the third clock signal terminal, and supply the signal at the reference voltage signal terminal to the second node under the control of the signal at the first node.

In some embodiments, the first node control sub-component comprises a sixth switching transistor; and a control electrode of the sixth switching transistor is electrically connected to the second node, a first electrode of the sixth switching transistor is electrically connected to the reference voltage signal terminal, and a second electrode of the sixth switching transistor is electrically connected to the first node.

In some embodiments, the second node control sub-component comprises a seventh switching transistor, a eighth switching transistor, a ninth switching transistor and a tenth switching transistor;

a control electrode and a first electrode of the seventh switching transistor are both electrically connected to the third clock signal terminal, and a second electrode of the seventh switching transistor is electrically connected to both a control electrode of the eighth switching transistor and a second electrode of the ninth switching transistor;

a first electrode of the eighth switching transistor is electrically connected to the third clock signal terminal, and a second electrode of the eighth switching transistor is electrically connected to the second node;

a control electrode of the ninth switching transistor is electrically connected to the first node, and a first electrode of the ninth switching transistor is electrically connected to the reference voltage signal terminal; and a control electrode of the tenth switch transistor is electrically connected to the first node, a first electrode of the tenth switching transistor is electrically connected to the reference voltage signal terminal, and a second electrode of the tenth switching transistor is electrically connected to the second node.

In some embodiments, the input component comprises an eleventh switching transistor; and a control electrode and a first electrode of the eleventh switching transistor are both electrically connected to the input signal terminal, and a second electrode of the eleventh switching transistor is electrically connected to the first node.

In some embodiments, the reset component comprises a twelfth switching transistor; and a control electrode of the twelfth switching transistor is electrically connected to the reset signal terminal, a first electrode of the twelfth switching transistor is electrically connected to the reference voltage signal terminal, and a second electrode of the twelfth switching transistor is electrically connected to the first node.

In some embodiments, the shift register further comprises a node stabilizing component; and the node stabilizing component is configured to supply the signal at the input signal terminal to the first node under the control of the third clock signal terminal.

In some embodiments, the node stabilizing component comprises a thirteenth switching transistor; and a control electrode of the thirteenth switching transistor is electrically connected to the third clock signal terminal, a first electrode of the thirteenth switching transistor is electrically connected to the input signal terminal, and a second electrode of the thirteenth switching transistor is electrically connected to the first node.

In some embodiments, the shift register further comprises an output stabilizing component; and the output stabilizing component is configured to supply the signal at the reference voltage signal terminal to the driving signal output terminal under the control of the reset signal terminal.

In some embodiments, the output stabilizing component comprises a fourteenth switching transistor; and a control electrode of the fourteenth switching transistor is electrically connected to the reset signal terminal, a first electrode of the fourteenth switching transistor is electrically connected to the reference voltage signal terminal, and a second electrode of the fourteenth switching transistor is electrically connected to the driving signal output terminal Further, an embodiment of the disclosure provides a gate driving circuit, comprising a plurality of above shift registers, which are cascaded at respective stages, the input signal terminal of the shift register at a first stage is electrically connected to a frame trigger signal terminal;

the input signal terminal of the shift register at other stage than the first stage is electrically connected to the driving signal output terminal of the shift register at a previous stage; and the reset signal terminal of the shift register at other stage than a last stage is electrically connected to the driving signal output terminal of the shift register at a next stage.

Further, an embodiment of the disclosure provides a display device, comprising the above gate driving circuit.

Further, an embodiment of the disclosure provides a driving method for the above shift register, comprising an input period, an input holding period, an output period, a chamfered waveform output period and a reset period; and during the input period, a first-potential signal is supplied to the input signal terminal and the third clock signal terminal, a second-potential signal is supplied to the reset signal terminal, the first clock signal terminal, the second clock signal terminal, and the chamfering control signal terminal, and the second-potential signal is output by the driving signal output terminal;

during the input holding period, the first-potential signal is supplied to the input signal terminal, the third clock signal terminal and the chamfering control signal terminal, the second-potential signal is supplied to the reset signal terminal, the first clock signal terminal and the second clock signal terminal, and the second-potential signal is output by the driving signal output terminal;

during the output period, the first-potential signal is supplied to the first clock signal terminal and the second clock signal terminal, the second-potential signal is supplied to the input signal terminal, the reset signal terminal, the third clock signal terminal and the chamfering control signal terminal, and the first-potential signal with a first amplitude is output by the driving signal output terminal;

during the chamfered waveform output period, the first-potential signal is supplied to the first clock signal terminal, the second clock signal terminal and the chamfering control signal terminal, the second-potential signal is supplied to the input signal terminal, the reset signal terminal and the third clock signal terminal, and the first-potential signal with a second amplitude is output by the driving signal output terminal;

during the reset period, the first-potential signal is supplied to the reset signal terminal and the third clock signal terminal, the second-potential signal is supplied to the input signal terminal, the first clock signal terminal, the second clock signal terminal and the chamfering control signal terminal, and the second-potential signal is output by the driving signal output terminal; and the first amplitude is different from the second amplitude.

BRIEF DESCRIPTION OF THE DRAWINGS

FIG. 3 is a schematic diagram illustrating a detailed structure of the shift register shown in FIG. 2a;

DETAILED DESCRIPTION OF THE EMBODIMENTS

In order to make a person skilled in the art better understand technical solutions of the present disclosure, detailed descriptions of the shift register, the driving method for the shift register, the gate driving circuit and the display device provided by embodiments of the present disclosure will be provided below in conjunction with drawings. It should be understood that, the embodiments described below are merely used to describe and explain the application, and are not intended to limit the application thereto. The embodiments and features in the embodiments in the application can be combined with each other if there is no conflict therebetween.

A conventional gate driving circuit consists of cascaded shift registers. A driving signal output terminal of the shift register at each stage is electrically connected to a corresponding gate line, and scanning signals are sequentially input to all the gate lines on a display panel by the cascaded shift registers. All the gate lines are electrically connected to respective gates of display transistors used for controlling charge of pixel electrodes in the display panel, and control to make the display transistors turn on and charge the pixel electrodes. However, a scanning signal with a chamfered waveform cannot be generated by the existing gate driving circuit, and thus a larger coupling capacitance may be produced between a gate and a drain of the display transistor at the moment that the display transistor is switched from Turn-On to Turn-Off, which will result in a larger jump voltage $^\Delta Vp$ on the pixel electrode, and thus leads to some problems such as flickering and image sticking when a display image is displayed by the display panel.

Figure 1:
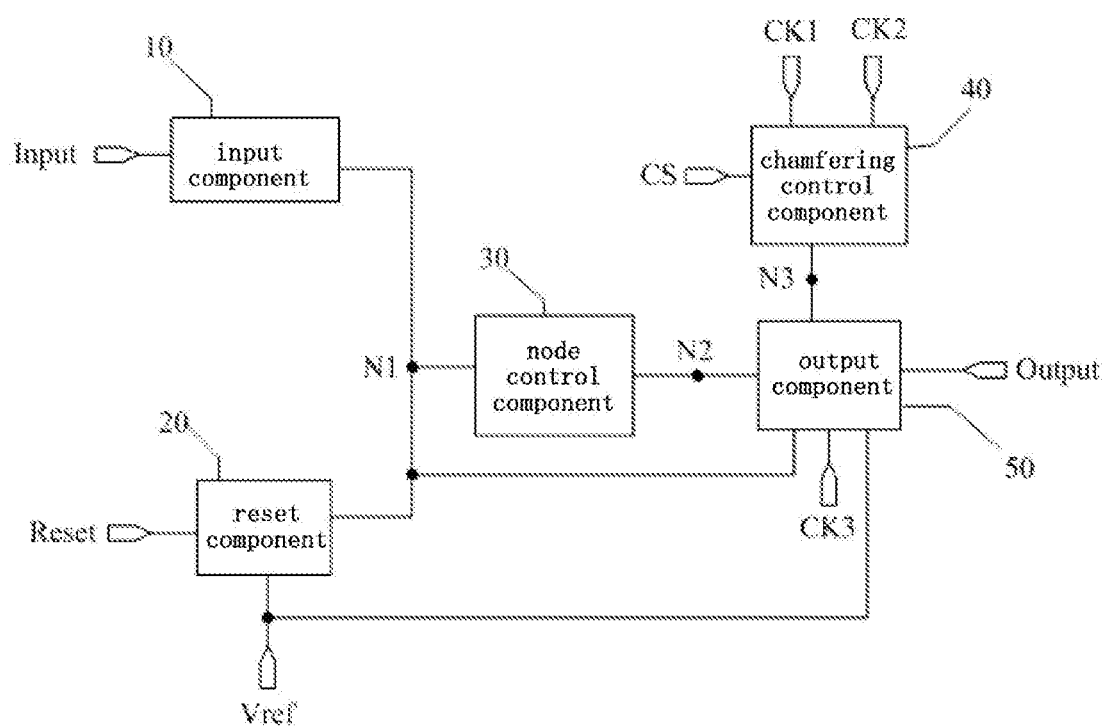
FIG. 1 is a structural schematic diagram of a shift register provided by an embodiment of the present disclosure.

An embodiment of the disclosure provides a shift register, as shown in FIG. 1, which includes an input component 10, a reset component 20, a node control component 30, a chamfering control component 40 and an output component 50, the input component 10 is electrically connected to an input signal terminal Input and a first node N1, to supply a signal at the input signal terminal Input to the first node N1 under the control of the input signal terminal Input;

the reset component 20 is electrically connected to a reset signal terminal Reset, a reference voltage signal terminal Vref and the first node N1, to supply a signal at the reference voltage signal terminal Vref to the first node N1 under the control of the reset signal terminal Reset;

the node control component 30 is electrically connected to the first node N1 and a second node N2, to make a potential of a signal at the first node N1 opposite to a potential of a signal at the second node N2;

the chamfering control component 40 is electrically connected to a first clock signal terminal CK1, a second clock signal terminal CK2, a chamfering control signal terminal CS and a third node N3, to supply a signal at the first clock signal terminal CK1 to the third node N3 under the control of the first clock signal terminal CK1, and supply a signal at the second clock signal terminal CK2 to the third node N3 under the control of the chamfering control signal terminal CS, and an amplitude of the signal at the second clock signal terminal CK2 is smaller than that of the signal at the first clock signal terminal CK1; and the output component 50 is electrically connected to the first node N1, the second node N2, the third node N3, a third clock signal terminal CK3 and a driving signal output terminal Output, to supply a signal at the third node N3 to the driving signal output terminal Output of the shift register under the control of the signal at the first node N1 and supply a signal at the reference voltage signal terminal Vref to the driving signal output terminal Output under the control of the third clock signal terminal CK3 and the signal at the second node N2.

The shift register provided by an embodiment of the disclosure comprises an input component, a reset component, a node control component, a chamfering control component and an output component; the input component is electrically connected to an input signal terminal and a first node, to supply a signal at the input signal terminal to the first node under the control of the input signal terminal; the reset component is electrically connected to a reset signal terminal, a reference voltage signal terminal and the first node, to supply a signal at the reference voltage signal terminal to the first node under the control of the reset signal terminal; the node control component is electrically connected to the first node and a second node, to make a potential of a signal at the first node opposite to a potential of a signal at the second node; the chamfering control component is electrically connected to a first clock signal terminal, a second clock signal terminal, a chamfering control signal terminal and a third node, to supply a signal at the first clock signal terminal to the third node under the control of the first clock signal terminal, and supply a signal at the second clock signal terminal to the third node under the control of the chamfering control signal terminal, and an amplitude of the signal at the second clock signal terminal is smaller than that of the signal at the first clock signal terminal; and the output component is electrically connected to the first node, the second node, the third node, a third clock signal terminal and a driving signal output terminal, to supply a signal at the third node to the driving signal output terminal of the shift register under the control of the signal at the first node and supply a signal at the reference voltage signal terminal to the driving signal output terminal under the control of the third clock signal terminal and the signal at the second node. In the shift register provided by the embodiment of the disclosure, by setting the chamfering control component and cooperation among the above five components, an amplitude of a scanning signal output by the driving signal output terminal is changed so as to generate a scanning signal with a chamfered waveform. The scanning signal with the chamfered waveform is sequentially input to each pixel unit in a corresponding row by a corresponding gate line, a jump voltage $^{\Delta}$Vp on a pixel electrode of the pixel unit can be reduced, thereby mitigating phenomena such as flashing and image sticking of the display panel and improving the display quality of the display panel.

As an example, in the shift register provided by the embodiment of the disclosure, the signal at the first clock signal terminal and the signal at the third clock signal terminal have a same signal period, opposite phases and a same amplitude. Moreover, the signal at the first clock signal terminal and the signal at the second clock signal terminal have a same signal period and a same phase.

As an example, in the shift register provided by the embodiment of the disclosure, the signal at the chamfering control signal terminal may be a clock signal, and a signal period of the clock signal is 1/2n of the signal period of the signal at the first clock signal terminal, and n may be a positive integer, for example, n=1. Particularly, in the above mentioned shift register provided by the embodiment of the disclosure, when n=1, in one cycle of the signal at the chamfering control signal terminal, as a duty ratio of the signal at the chamfering control signal terminal is approximated to that of the signal at the first clock signal terminal, a width of a chamfered part of the scanning signal at the driving signal output terminal is larger.

As an example, in the shift register provided by an embodiment of the disclosure, a valid pulse signal at the input signal terminal is a high-potential signal, and the signal at the reference voltage signal terminal is a low-potential signal. Alternatively, the valid pulse signal at the input signal terminal is a low-potential signal, and the signal at the reference voltage signal terminal is a high-potential signal.

Figure 2A:
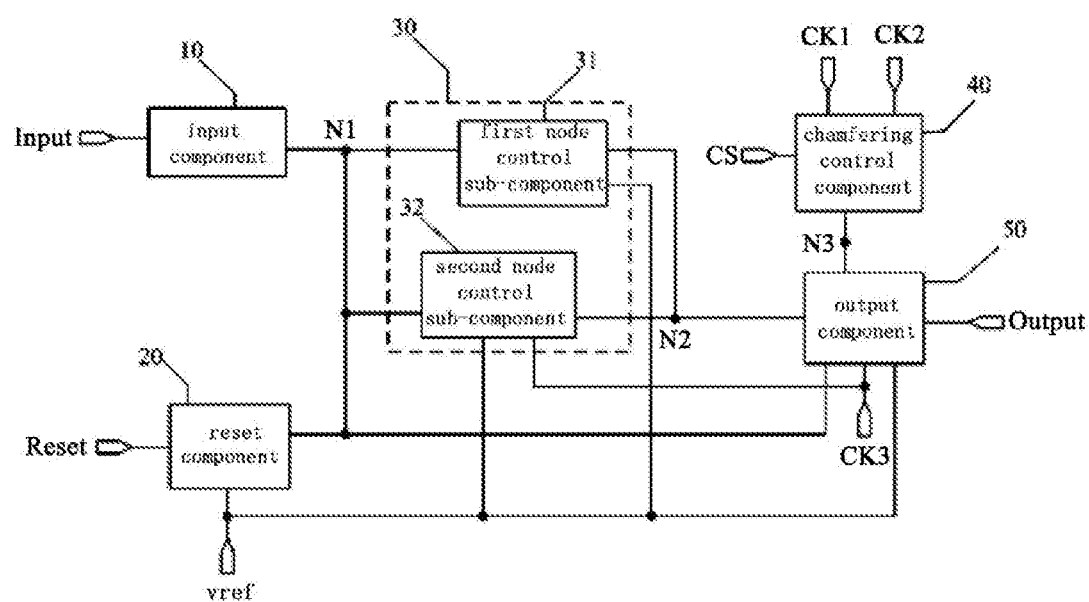
FIG. 2a is a structural schematic diagram of a shift register provided by an embodiment of the present disclosure.
Figure 2B:
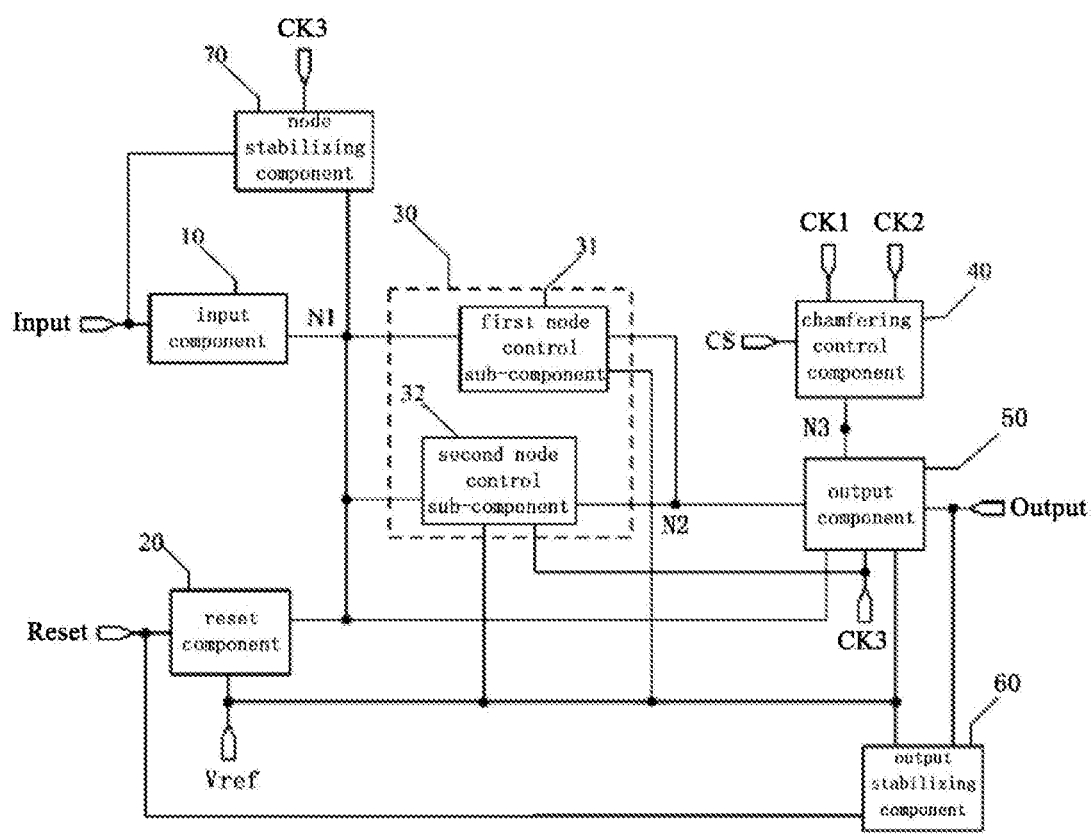
FIG. 2b is a structural schematic diagram of a shift register provided by an embodiment of the present disclosure.

As an example, in the shift register provided by an embodiment of the disclosure, as shown in FIGS. 2a and 2b, the node control component 30 may comprise a first node control sub-component 31 and a second node control sub-component 32;

the first node control sub-component 31 is electrically connected to the reference voltage signal terminal Vref, the first node N1 and the second node N2, to supply the signal at the reference voltage signal terminal Vref to the first node N1 under the control of the signal at the second node N2; and the second node control sub-component 32 is electrically connected to the third clock signal terminal CK3, the reference voltage signal terminal Vref, the first node N1 and the second node N2, to supply a signal at the third clock signal terminal CK3 to the second node N2 under the control of the third clock signal terminal CK3, and supply the signal at the reference voltage signal terminal Vref to the second node N2 under the control of the signal at the first node N1.

Moreover, after the driving signal output terminal Output finishes outputting of the scanning signal, in order to ensure that the potential of the signal at the driving signal output terminal Output is immediately opposite to that of the valid pulse signal at the input signal terminal Input, in an implementation, in the shift register provided by the embodiment of the disclosure, as shown in FIG. 2b, the shift register may further include an output stabilizing component 60; and the output stabilizing component 60 is electrically connected to the reset signal terminal Reset, the reference voltage signal terminal Vref and the driving signal output terminal Output to supply the signal at the reference voltage signal terminal Vref to the driving signal output terminal Output under the control of the reset signal terminal Reset.

Further, in order to obtain a stable potential at the first node N1, in an implementation, in the shift register provided by an embodiment of the disclosure, as shown in FIG. 2b, the shift register may further include a node stabilizing component 70; and the node stabilizing component 70 is electrically connected to the third clock signal terminal CK3, the input signal terminal Input and the first node N1, to supply the signal at the input signal terminal Input to the first node N1 under the control of the third clock signal terminal CK3.

In the following, the disclosure will be described in detail in combination with specific embodiments. It should be understood that, the embodiments are only for better explanation of the disclosure, but not limit the disclosure.

Figure 3:
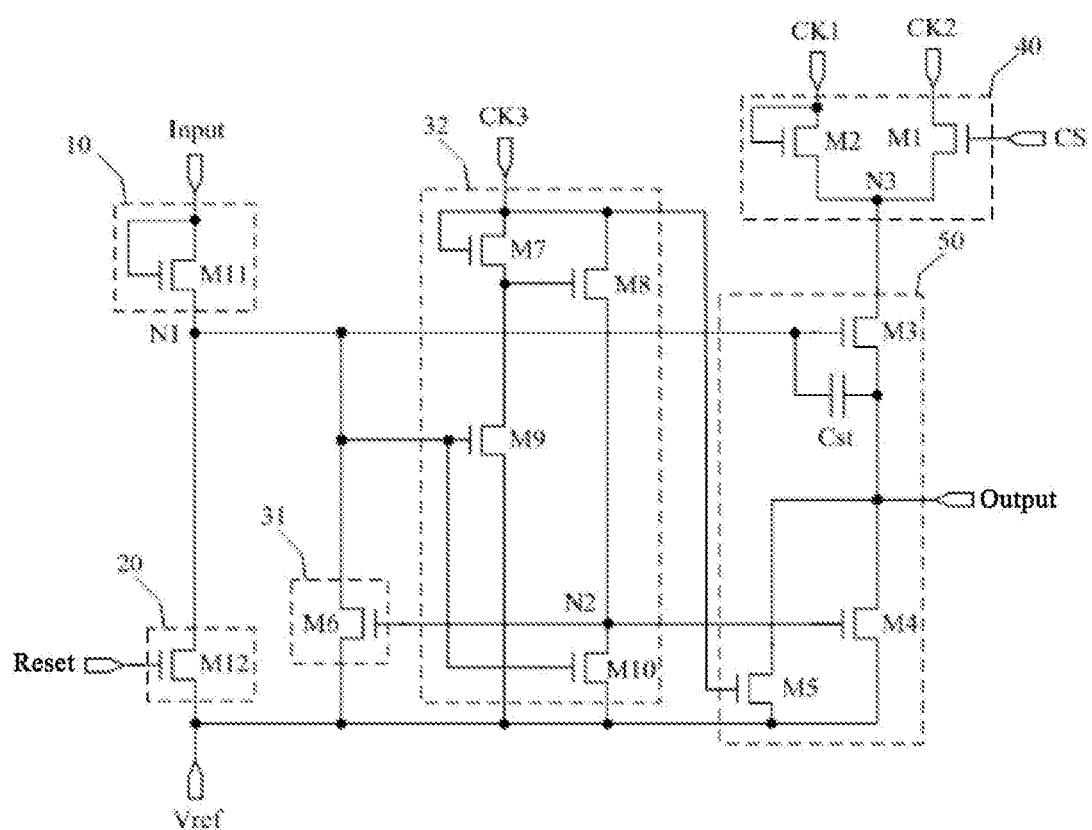
Figure 4:
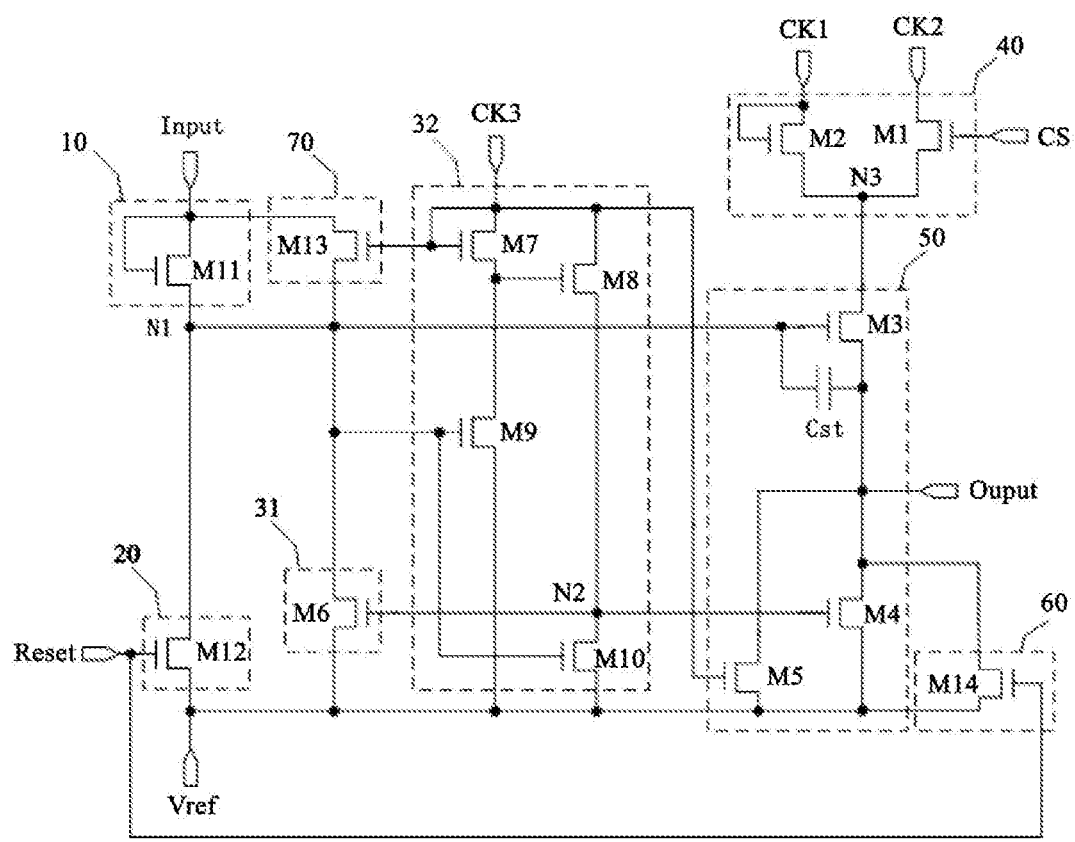
FIG. 4 is a schematic diagram illustrating a detailed structure of the shift register shown in FIG. 2b.

As an example, in the shift register provided by an embodiment of the disclosure, as shown in FIGS. 3 and 4, the input component 10 may include an eleventh switching transistor; and a control electrode and a first electrode of the eleventh switching transistor M11 are both electrically connected to the input signal terminal Input, and a second electrode of the eleventh switching transistor M11 is electrically connected to the first node N1.

As an example, in the shift register provided by an embodiment of the disclosure, as shown in FIGS. 3 and 4, the eleventh switching transistor M11 may be an N-type transistor or a P-type transistor. In a practical application, the type of the eleventh switching transistor M11 may be designed and determined based on an actual application environment, and is not limited herein.

As an example, in the shift register provided by an embodiment of the disclosure, when the eleventh switching transistor is turned on under the control of the signal at the input signal terminal, it may supply the signal at the input signal terminal to the first node.

As an example, in the shift register provided by an embodiment of the disclosure, as shown in FIGS. 3 and 4, the reset component 20 may include a twelfth switching transistor M12; and a control electrode of the twelfth switching transistor M12 is electrically connected to the reset signal terminal Reset, a first electrode of the twelfth switching transistor M12 is electrically connected to the reference voltage signal terminal Vref, and a second electrode of the twelfth switching transistor M12 is electrically connected to the first node N1.

As an example, in the shift register provided by an embodiment of the disclosure, as shown in FIGS. 3 and 4, the twelfth switching transistor M12 may be an N-type transistor or a P-type transistor. In a practical application, the type of the twelfth switching transistor M12 may be designed and determined based on an actual application environment, and is not limited herein.

As an example, in the shift register provided by an embodiment of the disclosure, when the twelfth switching transistor is turned on under the control of the signal at the reset signal terminal, it may supply the signal at the reference voltage signal terminal to the first node.

As an example, in the shift register provided by an embodiment of the disclosure, as shown in FIGS. 3 and 4, the chamfering control component 40 may include a switching transistor M1 and a second switching transistor M2;

a control electrode of the first switching transistor M1 is electrically connected to the chamfering control signal terminal CS, a first electrode of the first switching transistor M1 is electrically connected to the second clock signal terminal CK2, and a second electrode of the first switching transistor M1 is electrically connected to the third node N3; and both a control electrode and a first electrode of the second switching transistor M2 are electrically connected to the first clock signal terminal CK1, and a second electrode of the second switching transistor M2 is electrically connected to the third node N3.

As an example, in the shift register provided by an embodiment of the disclosure, as shown in FIGS. 3 and 4, the first switching transistor M1 and the second switching transistor may be N-type transistors or P-type transistors. In a practical application, the type of the first switching transistor M1 and the second switching transistor M2 may be designed and determined based on an actual application environment, and is not limited herein.

As an example, in the shift register provided by an embodiment of the disclosure, when the first switching transistor is turned on under the control of the signal at the chamfering control signal terminal, it may supply the signal at the second clock signal terminal to the third node; when the second switching transistor is turned on under the control of the signal at the first clock signal terminal, it may supply the signal at the first clock signal terminal to the third node.

As an example, in the shift register provided by an embodiment of the disclosure, as shown in FIGS. 3 and 4, the first node control sub-component 31 may include a sixth switching transistor M6; and a control electrode of the sixth switching transistor M6 is electrically connected to the second node N2, a first electrode of the sixth switching transistor M6 is electrically connected to the reference voltage signal terminal Vref, and a second electrode of the sixth switching transistor M6 is electrically connected to the first node N1.

As an example, in the shift register provided by an embodiment of the disclosure, as shown in FIGS. 3 and 4, the sixth switching transistor M6 may be an N-type transistor or a P-type transistor. In a practical application, the type of the sixth switching transistor M6 may be designed and determined based on an actual application environment, and is not limited herein.

As an example, in the shift register provided by an embodiment of the disclosure, when the sixth switching transistor is turned on under the control of the signal at the second node, it may supply the signal at the reference voltage signal terminal to the first node.

As an example, in the shift register provided by an embodiment of the disclosure, as shown in FIGS. 3 and 4, the second node control sub-component 32 may include a seventh switching transistor M7, a eighth switching transistor M8, a ninth switching transistor M9 and a tenth switching transistor M10;

a control electrode and a first electrode of the seventh switching transistor M7 are both electrically connected to the third clock signal terminal Ck3, and a second electrode of the seventh switching transistor M7 is electrically connected to both a control electrode of the eighth switching transistor M8 and a second electrode of the ninth switching transistor M9;

a first electrode of the eighth switching transistor M8 is electrically connected to the third clock signal terminal CK3, and a second electrode of the eighth switching transistor M8 is electrically connected to the second node N2;

a control electrode of the ninth switching transistor M9 is electrically connected to the first node N1, and a first electrode of the ninth switching transistor M9 is electrically connected to the reference voltage signal terminal Vref; and a control electrode of the tenth switch transistor M10 is electrically connected to the first node N1, a first electrode of the tenth switching transistor M10 is electrically connected to the reference voltage signal terminal Vref, and a second electrode of the tenth switching transistor M10 is electrically connected to the second node N2.

As an example, in the shift register provided by an embodiment of the disclosure, as shown in FIGS. 3 and 4, the seventh switching transistor M7, the eighth switching transistor M8, the ninth switching transistor M9 and the tenth switching transistor M10 may be N-type transistors or P-type transistors. In a practical application, the type of the seventh switching transistor M7, the eighth switching transistor M8, the ninth switching transistor M9 and the tenth switching transistor M10 may be designed and determined based on an actual application environment, and is not limited herein.

As an example, in the shift register provided by an embodiment of the disclosure, when the seventh switching transistor is turned on under the control of the signal at the third clock signal terminal, it may supply the signal at the third clock signal terminal to the control electrode of the eighth switching transistor and the second electrode of the ninth switching transistor; when the eighth switching transistor is turned on under the control of the signal at the control electrode of the eighth switching transistor, it may supply the signal at the third clock signal terminal to the second node; when the ninth switching transistor is turned on under the control of the signal at the first node, it may supply the signal at the reference voltage signal terminal to the control electrode of the eighth switching transistor; and when the tenth switching transistor is turned on under the control of the signal at the first node, it may supply the signal at the reference voltage signal terminal to the second node.

As an example, in the shift register provided by an embodiment of the disclosure, in the preparation process, a size (i.e. a width-to-length ratio W/L of a gate of a transistor) of the tenth switching transistor is generally set to be larger than that of the seventh switching transistor, so that when the signal at the input signal terminal is a valid pulse signal, a potential at the first node is the potential of the valid pulse signal at the input signal terminal, and thus a rate at which the tenth switching transistor supplies the signal at the reference voltage signal terminal to the second node under the control of the first node is larger than that at which the seventh switching transistor supplies the signal at the third clock signal terminal to the second node under the control of the signal at the third clock signal terminal, which can ensure that the potential at the second node is opposite to that at the first node during this period.

As an example, in the shift register provided by an embodiment of the disclosure, as shown in FIGS. 3 and 4, the output component 50 may include a third switching transistor M3, a fourth switching transistor M4, a fifth switching transistor M5 and a storage capacitor Cst;

a control electrode of the third switching transistor M3 is electrically connected to the first node N1, a first electrode of the third switching transistor M3 is electrically connected to the third node N3, and a second electrode of the third switching transistor M3 is electrically connected to the driving signal output terminal Output;

a control electrode of the fourth switching transistor M4 is electrically connected to the second node N2, a first electrode of the fourth switching transistor M4 is electrically connected to the reference voltage signal terminal Vref, and a second electrode of the fourth switching transistor M4 is electrically connected to the driving signal output terminal Output;

a control electrode of the fifth switching transistor M5 is electrically connected to the third clock signal terminal CK3, a first electrode of the fifth switching transistor M5 is electrically connected to the reference voltage signal terminal Vref, and a second electrode of the fifth switching transistor M5 is electrically connected to the driving signal output terminal Output; and one terminal of the storage capacitor Cst is electrically connected to the first node N1, and the other terminal of the storage capacitor Cst is electrically connected to the driving signal output terminal Output.

As an example, in the shift register provided by an embodiment of the disclosure, as shown in FIGS. 3 and 4, the third switching transistor M3, the fourth switching transistor M4 and the fifth switching transistor M5 may be N-type transistors or P-type transistors. In a practical application, the type of the third switching transistor, the fourth switching transistor and the fifth switching transistor may be designed and determined based on an actual application environment, and is not limited herein.

As an example, in the shift register provided by an embodiment of the disclosure, when the third switching transistor is turned on under the control of the signal at the first node, it may supply the signal at the third node to the driving signal output terminal; when the fourth switching transistor is turned on under the control of the signal at the second node, it may supply the signal at the reference voltage signal terminal to the driving signal output terminal; when the fifth switching transistor is turned on under the control of the signal at the third clock signal terminal, it may supply the signal at the reference voltage signal terminal to the driving signal output terminal. The storage capacitor may be charged or discharged under the control of the signal at the first node and the signal at the driving signal output terminal, and when the first node is floating, a voltage difference between the two terminals of the storage capacitor can be kept stable due to the bootstrap effect of the storage capacitor, that is, the voltage difference between the first node and the driving signal output terminal is maintained to be stable.

As an example, in the shift register provided by an embodiment of the disclosure, as shown in FIG. 4, the node stabilizing component 70 may include a thirteenth switching transistor M13; and a control electrode of the thirteenth switching transistor M13 is electrically connected to the third clock signal terminal CK3, a first electrode of the thirteenth switching transistor M13 is electrically connected to the input signal terminal Input, and a second electrode of the thirteenth switching transistor M13 is electrically connected to the first node N1.

As an example, in the shift register provided by an embodiment of the disclosure, as shown in FIG. 4, the thirteenth switching transistor M13 may be an N-type transistor or a P-type transistor. In a practical application, the type of the thirteen switching transistor may be designed and determined based on an actual application environment, and is not limited herein.

As an example, in the shift register provided by an embodiment of the disclosure, when the thirteenth switching transistor is turned on under the control of the signal at the third clock signal terminal, it may supply the signal at the input signal terminal to the first node.

As an example, in the shift register provided by an embodiment of the disclosure, as shown in FIG. 4, the output stabilizing component 60 may include a fourteenth switching transistor M14; and a control electrode of the fourteenth switching transistor M14 is electrically connected to the reset signal terminal Reset, a first electrode of the fourteenth switching transistor M14 is electrically connected to the reference voltage signal terminal Vref, and a second electrode of the fourteenth switching transistor M14 is electrically connected to the driving signal output terminal Output.

As an example, in the shift register provided by an embodiment of the disclosure, as shown in FIG. 4, the fourteenth switching transistor M14 may be an N-type transistor or a P-type transistor. In a practical application, the type of the fourteenth switching transistor may be designed and determined based on an actual application environment, and is not limited herein.

As an example, in the shift register provided by an embodiment of the disclosure, when the fourteenth switching transistor is turned on under the control of the signal at the reset signal terminal, it may supply the signal at the reference voltage signal terminal to the driving signal output terminal The above is only intended to illustrate examples of the specific structures of the various components in the shift register provided by the disclosure, the specific structures of the various components are not limited thereto, and other structures known by a person skilled in the art may be possible. The structures of the various components in the shift register are not limited herein.

In order to simplify the preparation process, as an example, in the shift register provided by an embodiment of the disclosure, when the valid pulse signal at the input signal terminal Input is at a high potential, as shown in FIGS. 3 and 4, all switching transistors may be N-type switching transistors.

Alternatively, as an example, when the valid pulse signal at the input signal terminal Input is at a low potential, all switching transistors may be P-type switching transistors, which is not limited herein.

Further, as an example, in the shift register provided by an embodiment of the disclosure, the N-type switching transistor is turned on under the action of a high-potential signal and turned off under the action of a low-potential signal; and the P-type switching transistor is turned off under the action of a high-potential signal and turned on under the action of a low-potential signal.

It should be explained that, the switching transistor mentioned in the above embodiment of the disclosure may be a thin film transistor (TFT), or a metal oxide semiconductor field effect transistors (MOS), and is not limited herein. As an example, the control electrode of the above switching transistor may be a gate; according to the type of the switching transistor and the signal, the first electrode may be a source, the second electrode may be a drain; or the first electrode may be a drain and the second electrode may be a source. The first electrode and the second electrode are not distinguished from each other herein.

The working process of the shift register provided by the above embodiment of the disclosure is described in conjunction with a circuit timing diagram. In the following, n=1 is taken as an example. In the following description, a high-potential signal is represented by 1, a low-potential signal is represented by 0, and 1 or 0 represents a logical potential of a signal, and is only intended to better explain the working process of the shift register provided by the above embodiment of the disclosure, rather than represents a potential applied to a gate of a switching transistor in a specific implementation.

Figure 5:
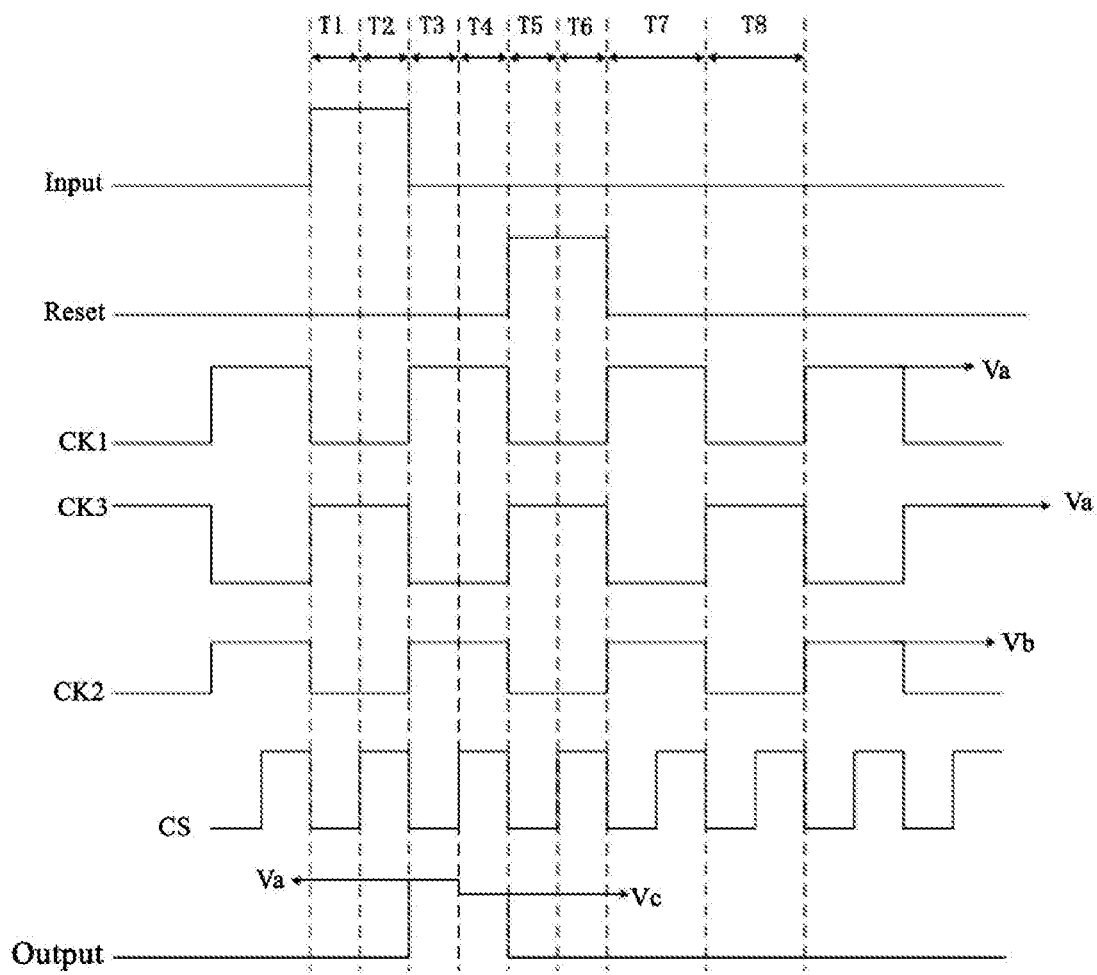
FIG. 5 is a timing chart illustrating an input signal and an output signal provided by an embodiment of the application.

The working process of the shift register is described by taking the structure of the shift register shown in FIG. 4 as an example, the signal at the reference voltage signal terminal Vref is a low-potential signal, and the timing chart for the corresponding input and output signals is shown in FIG. 5. Specifically, in the timing chart for the corresponding input and output signals as shown in FIG. 5, an input period T1, an input holding period T2, an output period T3, a chamfered waveform output period T4 and a reset period T5 are selected. In FIG. 5, Va represents an amplitude of the signal at the first clock signal terminal CK1, Vb represents an amplitude of the signal at the second clock signal terminal CK2, and Vc represents an amplitude of the signal at the third node N3 during the chamfered waveform output period T4; and Va>Vb.

During the input period T1, Input=1, Reset=0, CK1=0, CK2=0, CK3=1, CS=0.

Since Input=1, the eleventh switching transistor M11 is turned on to supply the high-potential signal at the input signal terminal Input to the first node N1, so that the signal at the first node N1 is a high-potential signal to control the third switching transistor M3, the ninth switching transistor M9 and the tenth switching transistor M10 to be turned on. The ninth switching transistor M9, which is turned on, may supply the low-potential signal at the reference voltage signal terminal Vref to the control electrode of the eighth switching transistor M8 to control the eighth switching transistor M8 to be turned off The tenth switching transistor M10, which is turned on, may supply the low-potential signal at the reference voltage signal terminal Vref to the second node N2, so that the signal at the second node N2 is a low-potential signal to control the fourth switching transistor M4 and the sixth switching transistor M6 to be turned off Since CK1=0, the second switching transistor M2 is turned off Since CS=0, the first switching transistor M1 is turned off Since CK3=1, the fifth switching transistor M5 is turned on to supply the low-potential signal at the reference voltage signal terminal Vref to the driving signal output terminal Output to charge the storage capacitor Cst, and a low-potential scanning signal is output by the driving signal output terminal Output. Since CK3=1, the thirteenth switching transistor M13 is turned on to supply a high-potential signal at the input signal terminal Input to the first node N1, further making the signal at the first node N1 be a high-potential signal. Since Reset=0, the twelfth switching transistor M12 and the fourteenth switching transistor M14 are both turned off During the input holding period T2, Input=1, Reset=0, CK1=0, CK2=0, CK3=1, CS=1.

Since Input=1, the eleventh switching transistor M11 is turned on to supply the high-potential signal at the input signal terminal Input to the first node N1, so that the signal at the first node N1 is a high-potential signal to control the third switching transistor M3, the ninth switching transistor M9 and the tenth switching transistor M10 to be turned on. The ninth switching transistor M9, which is turned on, may supply the low-potential signal at the reference voltage signal terminal Vref to the control electrode of the eighth switching transistor M8 to control the eighth switching transistor M8 to be turned off. The tenth switching transistor M10, which is turned on, may supply the low-potential signal at the reference voltage signal terminal Vref to the second node N2, so that the signal at the second node N2 is a low-potential signal to control the fourth switching transistor M4 and the sixth switching transistor M6 to be turned off Since CK1=0, the second switching transistor M2 is turned off Since CS=1, the first switching transistor M1 is turned on and the third switching transistor M3 is turned on to supply the low-potential signal at the second clock signal terminal CK2 to the driving signal output terminal Output. Since CK3=1, the fifth switching transistor M5 is turned on to supply the low-potential signal at the reference voltage signal terminal Vref to the driving signal output terminal Output to charge the storage capacitor Cst, and a low-potential scanning signal is output by the driving signal output terminal Output. Since CK3=1, the thirteenth switching transistor M13 is turned on to supply a high-potential signal at the input signal terminal Input to the first node N1, further making the signal at the first node N1 be a high-potential signal. Since Reset=0, the twelfth switching transistor M12 and the fourteenth switching transistor M14 are both turned off.

During the output period T3, Input=0, Reset=0, CK1=1, CK2=1, CK3=0, CS=0.

Since Input=0, the eleventh switching transistor M11 is turned off to make the first node N1 floating. Since the first node N1 is floating, the signal at the first node N1 is maintained to be a high-potential signal due to the bootstrap effect of the storage capacitor Cst to control the third switching transistor M3, the ninth switching transistor M9 and the tenth switching transistor M10 to be turned on. Since CK1=0, the second switching transistor M2 is turned on to supply the high-potential signal at the first clock signal terminal CK1 to the third node N3. Since the third switching transistor M3 is turned on, the high-potential signal at the first clock signal terminal CK1 may be supplied to the driving signal output terminal Output, so that a high-potential scanning signal is output by the driving signal output terminal Output. Due to the bootstrap effect of the storage capacitor Cst, the voltage difference between the two terminals of the storage capacitor Cst may be kept stable, so that the potential of the signal at the first node N1 is further pulled up to make the third switching transistor M3, the ninth switching transistor M9 and the tenth switching transistor M10 be completely turned on. The third switching transistor M3, which is completely turned on, may provide the high-potential signal at the first clock signal terminal CK1 to the driving signal output terminal Output without any voltage loss, so that the amplitude of the scanning signal is Va. The ninth switching transistor M9, which is completely turned on, may supply the low-potential signal at the reference voltage signal terminal Vref to the control electrode of the eighth switching transistor M8 to control the eighth switching transistor M8 to be turned off. The tenth switching transistor M10, which is completely turned on, may supply the low-potential signal at the reference voltage signal terminal Vref to the second node N2, so that the signal at the second node N2 is a low-potential signal, to control the fourth switching transistor M4 and the sixth switching transistor M6 to be turned off Since CS=0, the first switching transistor M1 is turned off. Since CK3=0, the fifth switching transistor M5 and the thirteenth switching transistor M13 are both turned off Since Reset=0, the twelfth switching transistor M12 and the fourteenth switching transistor M14 are both turned off.

During the chamfered waveform output period T4, Input=0, Reset=0, CK1=1, CK2=1, CK3=0, CS=1.

Since Input=0, the eleventh switching transistor M11 is turned off to make the first node N1 be floating. Since the first node N1 is floating, the signal at the first node N1 is maintained to be a high-potential signal due to the bootstrap effect of the storage capacitor Cst to control the third switching transistor M3, the ninth switching transistor M9 and the tenth switching transistor M10 to be turned on. Since CK1=1, the second switching transistor M2 is turned on to supply the high-potential signal at the first clock signal terminal CK1 to the third node N3. Since CS=1, the first switching transistor M1 is turned on to supply the high-potential signal at the second clock signal terminal CK2 to the third node N3. Since the third switching transistor M3 is turned on, the signal at the third node N3 may be supplied to the driving signal output terminal Output so that a chamfered high-potential scanning signal is output by the driving signal output terminal Output. Due to the bootstrap effect of the storage capacitor Cst, the voltage difference between the two terminals of the storage capacitor Cst may be kept stable, so that the potential of the signal at the first node N1 is further pulled up to make the third switching transistor M3, the ninth switching transistor M9 and the tenth switching transistor M10 be completely turned on. The third switching transistor M3, which is completely turned on, may supply the signal at the third node N3 to the driving signal output terminal Output without any voltage loss. Since Va>Vb, a relationship between the signal at the first clock signal terminal CK1 and the signal at the second clock signal terminal CK2 may be considered as a current path in which a current is flowed from the first clock signal terminal CK1 to the second clock signal terminal CK2 via the second switching transistor M2, the third node N3, and the first switching transistor M1. Based on the principle of conservation of electrical current, $$\frac{Va - Vb}{R1 + R2} = \frac{Va - Vc}{R2}, \text{ i.e. } Vc = \frac{VaR1 + VbR2}{R1 + R2},$$

in which, R1 represents a resistance of the first switching transistor M1 when the first switching transistor M1 is turned on, and R2 represents a resistance of the second switching transistor M2 when the second switching transistor M2 is turned on, so that Va>Vc>Vb. Therefore, the third switching transistor M3 supplies the signal at the third node N3 to the driving signal output terminal Output without any voltage loss, and the amplitude of the scanning signal is Vc, so that a scanning signal with a chamfered waveform may be output. The ninth switching transistor M9, which is completely turned on, may supply the low-potential signal at the reference voltage signal terminal Vref to the control electrode of the eighth switching transistor M8 to control the eighth switching transistor M8 to be turned off. The tenth switching transistor M10, which is completely turned on, may supply the low-potential signal at the reference voltage signal terminal Vref to the second node N2, so that the signal at the second node N2 is a low-potential signal, to control the fourth switching transistor M4 and the sixth switching transistor M6 to be turned off. Since CK3=0, the fifth switching transistor M5 and the thirteenth switching transistor M13 are both turned off. Since Reset=0, the twelfth switching transistor M12 and the fourteenth switching transistor M14 are both turned off.

During the reset period T5, Input=0, Reset=1, CK1=0, CK2=0, CK3=1, CS=0.

Since Input=0, the eleventh switching transistor M11 is turned off. Since Reset=1, the twelfth switching transistor M12 is turned on to supply the low-potential voltage at the reference voltage signal terminal Vref to the first node N1 so that the signal at the first node N1 is a low-potential signal to control the third switching transistor M3, the ninth switching transistor M9 and the tenth switching transistor M10 to be turned off. Since CK3=1, the seventh switching transistor M7 is turned on and the high-potential signal at the third clock signal terminal CK3 is supplied to the control electrode of the eighth switching transistor M8 to control the eighth switching transistor M8 to be turned on. The eighth switching transistor M8, which is turned on, supplies the high-potential signal at the third clock signal terminal CK3 to the second node N2, so that the signal at the second node N2 is a high-potential signal to control both the fourth switching transistor M4 and the sixth switching transistor M6 to be turned on. The sixth switching transistor M6, which is turned on, supplies a low-potential signal at the reference voltage signal terminal Vref to the first node N1, further making the signal at the first node N1 be a low-potential signal. The fourth switching transistor M4, which is turned on, supplies a low-potential signal at the reference voltage signal terminal Vref to the driving signal output Output, so that a low-potential scanning signal is output by the driving signal output terminal Output. Since CK3=1, the fifth switching transistor M5 is turned on to supply the low-potential signal at the reference voltage signal terminal Vref to the driving signal output Output, further enabling the driving signal output terminal Output to output a low-potential scanning signal. Since CK3=1, the thirteenth switching transistor M13 is turned on to supply the low-potential signal at the input signal terminal Input to the first node N1, further making the signal at the first node N1 be a low-potential signal. Since Reset=1, the fourteenth switching transistor M14 is turned on to supply the low-potential signal at the reference voltage signal terminal Vref to the driving signal output Output, further enabling the driving signal output terminal Output to output a low-potential scanning signal.

After the reset period T5, the working process may further include a reset holding period T6. In the reset holding period T6, Input=0, Reset=1, CK1=0, CK2=0, CK3=1 and CS=1, it can be seen that, except that the signal at the chamfering control signal terminal CS becomes a high-potential signal, the rest of the signals are the same as in the reset period T5. Since the third switching transistor M3 is turned off, the signal at the second clock signal terminal CK2 will not be transmitted to the driving signal output Output, so that the driving signal output terminal Output keeps output of the low-potential scanning signal. The other operations during the reset holding period T6 are the same as those during the reset period T5, and will be omitted herein.

After the reset holding period T6, the working process may further include a first output holding period T7 and a second output holding period T8. During the first output holding period T7, Input=0, Reset=0, CK1=1, CK2=1, CK3=0. Since Input=0, the eleventh switching transistor M11 is turned off. Since Reset=0, the twelfth switching transistor M12 is turned off. Since CK3=0, the seventh switching transistor M7 is turned off. Therefore, the second node N2 is floating. Since there is no low-potential signal transmitted to the second node N2, the second node N2 remains at a high potential to control both the fourth switching transistor M4 and the sixth switching transistor M6 to be turned on. The sixth switching transistor M6, which is turned on, supplies a low-potential signal at the reference voltage signal terminal Vref to the first node N1, so that the signal at the first node N1 is a low-potential signal to control the third switching transistors M3, the ninth switching transistor M9 and the tenth switching transistor M10 all to be turned off. The fourth switching transistor M4, which is turned on, supplies a low-potential signal at the reference voltage signal terminal Vref to the driving signal output Output, so that a low-potential scanning signal is output by the driving signal output terminal Output.

In the second output holding period T8, Input=0, Reset=0, CK1=0, CK2=0 and CK3=1. Since Input=0, the eleventh switching transistor M11 is turned off. Since Reset=0, the twelfth switching transistor M12 is turned off. Since CK3=1, the seventh switching transistor M7 is turned on to supply the high-potential signal at the third clock signal terminal CK3 to the control electrode of the eighth switching transistor M8 to control the eighth switching transistor M8 to be turned on. The eighth switching transistor M8, which is turned on, supplies the high-potential signal at the third clock signal terminal CK3 to the second node N2, so that the signal at the second node N2 is a high-potential signal to control both the fourth switching transistor M4 and the sixth switching transistor M6 to be turned on. The sixth switching transistor M6, which is turned on, supplies the low-potential signal at the reference voltage signal terminal Vref to the first node N1, so that the signal at the first node N1 is a low-potential signal to control the third switching transistor M3, the ninth switching transistor M9, and the tenth switching transistor M10 all to be turned on. The fourth switching transistor M4, which is turned on, supplies the low-potential signal at the reference voltage signal terminal Vref to the driving signal output Output, so that a low-potential scanning signal is output by the driving signal output terminal Output. Since CK3=1, the fifth switching transistor M5 is turned on to supply the low-potential signal at the reference voltage signal terminal Vref to the driving signal output Output, further enabling the driving signal output terminal Output to output a low-potential scanning signal.

In the above shift register provided by the embodiment of the disclosure, after the second output holding period T8, the operations during the first output holding period T7 and the second output holding period T8 are repeatedly executed until a next frame begins.

In the above example, the signal at the first clock signal terminal and the signal at the second clock signal terminal of different amplitudes are supplied to the driving signal output terminal during the output period T3 and the chamfered waveform output period T4, respectively, so that a scanning signal with a chamfered waveform is output by the driving signal output terminal. Moreover, the resistance R1 of the first switching transistor and the resistance R2 of the second switching transistor are determined by the width-to-length ratio of the first and second switching transistors, respectively, and the higher the width-to-length ratio of the switching transistor is, the smaller the corresponding resistance is. Therefore, the amplitude of Vc can also be adjusted by adjusting the resistance R1 of the first switching transistor and the resistance R2 of the second switching transistor. Of course, the amplitude of Vc can also be adjusted by adjusting the amplitude of the signal at the first clock signal terminal and the amplitude of the signal at the second clock signal terminal. The greater the difference between the amplitude of the signal at the first clock signal terminal and the amplitude of the signal at the second clock signal terminal is, the greater the amplitude difference in the chamfered scanning signal is.

In a conventional liquid crystal display panel, the jump voltage ΔVp generated on the pixel electrode satisfies a formula:

$$\Delta Vp = \frac{Cgs(Vgh - Vgl)}{Clc + Cgs + C0},$$

in which Cgs represents a capacitance value of a coupling capacitance between a gate and a drain in a display transistor, Clc represents a capacitance value of a liquid crystal layer, C0 is a capacitance value of the remaining related coupling capacitance, and Vgh represents a voltage value of the high-potential scanning signal, and Vgl represents a voltage value of the low-potential scanning signal. In the above example, the amplitude of the scanning signal during the chamfered waveform output period is smaller than that during the output period. That is, when Vgh is reduced, based on the above formula, ΔVp can be reduced, thereby mitigating phenomena such as flashing and image sticking of the display panel and improving the display quality of the display panel.

Figure 6:
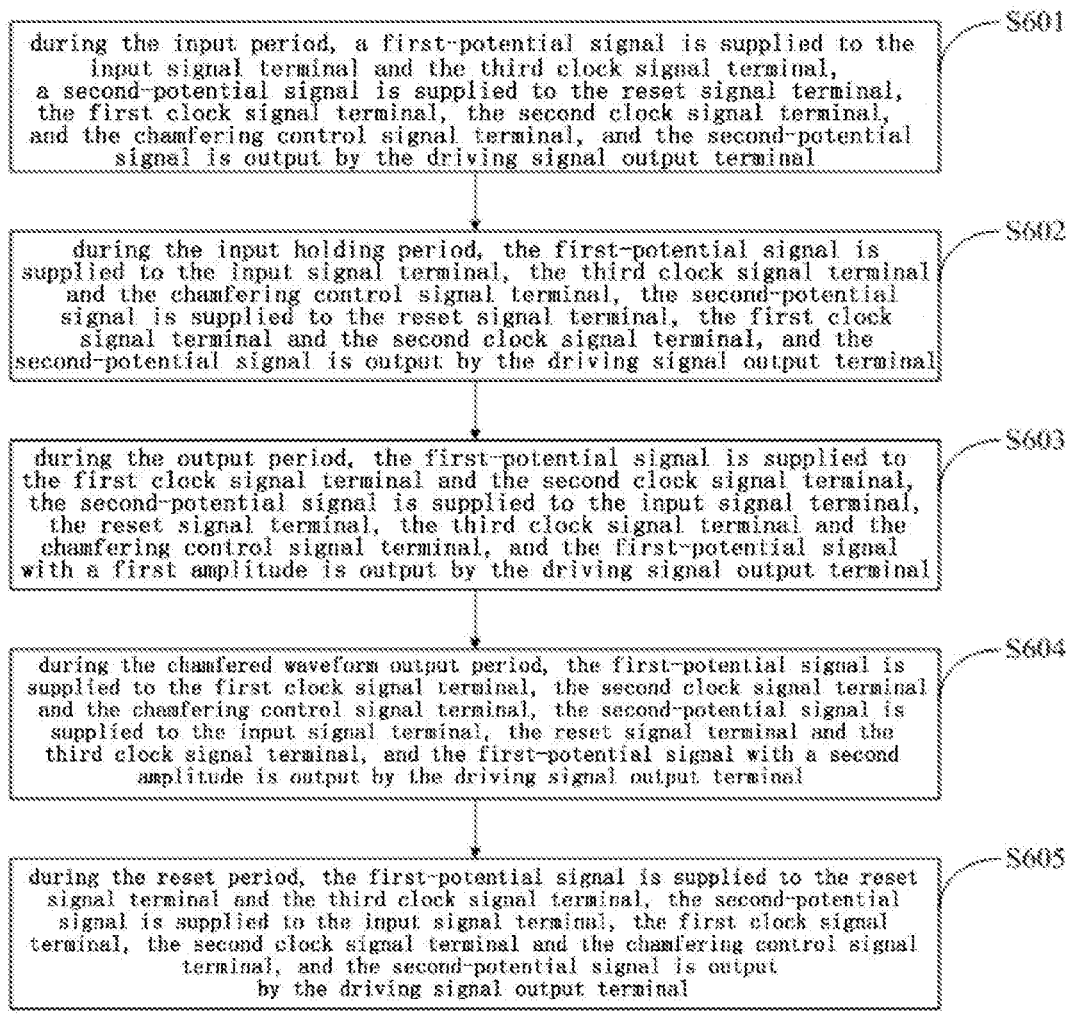
FIG. 6 is a flow chart illustrating a driving method provided by an embodiment of the present disclosure.

Based on the same idea, an embodiment of the disclosure further provides a driving method for any of the above shift registers, as shown in FIG. 6, including an input period, an input holding period, an output period, a chamfered waveform output period and a reset period:

S601. during the input period, a first-potential signal is supplied to the input signal terminal and the third clock signal terminal, a second-potential signal is supplied to the reset signal terminal, the first clock signal terminal, the second clock signal terminal, and the chamfering control signal terminal, and the second-potential signal is output by the driving signal output terminal;

S601. during the input holding period, the first-potential signal is supplied to the input signal terminal, the third clock signal terminal and the chamfering control signal terminal, the second-potential signal is supplied to the reset signal terminal, the first clock signal terminal and the second clock signal terminal, and the second-potential signal is output by the driving signal output terminal;

S603. during the output period, the first-potential signal is supplied to the first clock signal terminal and the second clock signal terminal, the second-potential signal is supplied to the input signal terminal, the reset signal terminal, the third clock signal terminal and the chamfering control signal terminal, the first-potential signal with a first amplitude is output by the driving signal output terminal;

S604. during the chamfered waveform output period, the first-potential signal is supplied to the first clock signal terminal, the second clock signal terminal and the chamfering control signal terminal, the second-potential signal is supplied to the input signal terminal, the reset signal terminal and the third clock signal terminal, the first-potential signal with a second amplitude is output by the driving signal output terminal;

S605. during the reset period, the first-potential signal is supplied to the reset signal terminal and the third clock signal terminal, the second-potential signal is supplied to the input signal terminal, the first clock signal terminal, the second clock signal terminal and the chamfering control signal terminal, and the second-potential signal is output by the driving signal output terminal; and the first amplitude is different from the second amplitude.

Figure 8:
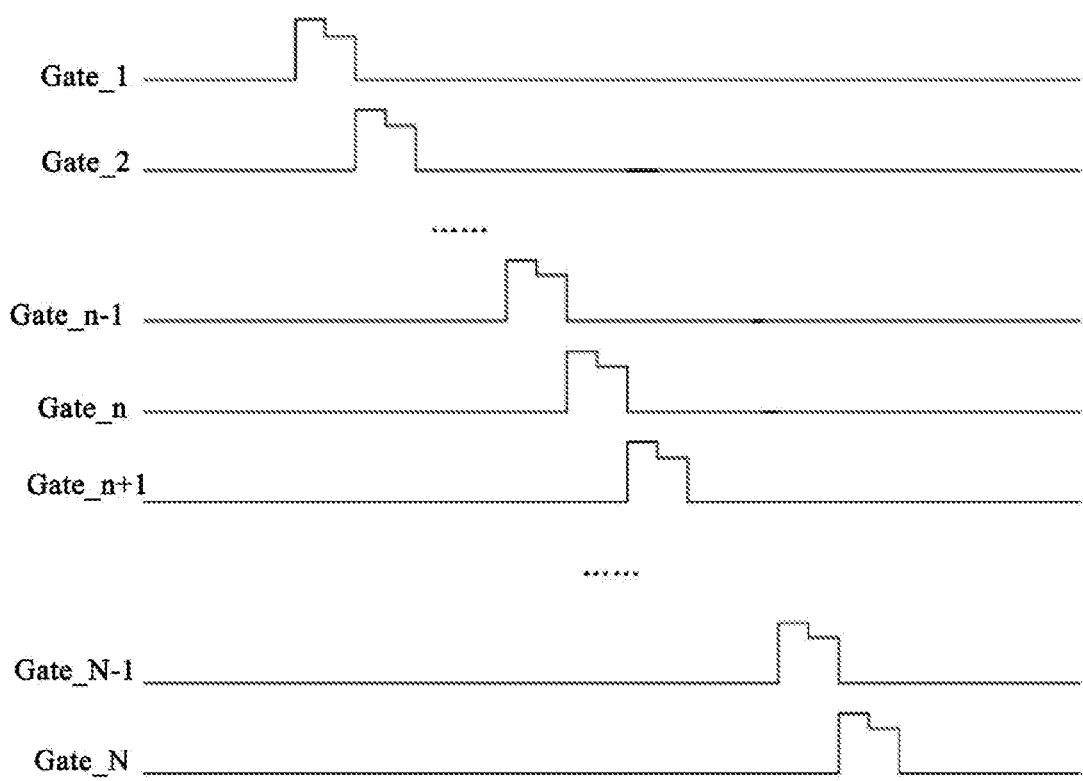
FIG. 8 is a schematic diagram illustrating a scanning signal output by the gate driving circuit provided by an embodiment of the present disclosure.

In the embodiment shown in FIG. 8, the first amplitude is larger than the second amplitude.

In the driving method provided by the embodiment of the disclosure, the amplitude of the scanning signal output by the driving signal output terminal may be changed to generate a scanning signal with a chamfered waveform, and when the scanning signal with the chamfered waveform is sequentially input to each pixel unit in a corresponding row by a corresponding gate line, a jump voltage ΔVp on a pixel electrode of the pixel unit can be reduced, thereby mitigating phenomena such as flashing and image sticking of the display panel and improving the display quality of the display panel.

As an example, in the driving method provided by an embodiment of the disclosure, the first-potential signal is a high-potential signal, and the second-potential signal is a low-potential signal. Alternatively, the first-potential signal is a low-potential signal, and the second-potential signal is a high-potential signal.

As an example, the driving method provided by an embodiment of the disclosure, after the reset period, may further include: the reset holding period, during which the second-potential signal is supplied to the input signal terminal, the first clock signal terminal and the second clock signal terminal, and the first-potential signal is supplied to the reset signal terminal, the third clock signal terminal and the chamfering control signal terminal.

As an example, the driving method provided by an embodiment of the disclosure, after the reset holding period, may further include: the first output holding period and the second output holding period.

During the first output holding period, the second-potential signal is supplied to all of the input signal terminal, the reset signal terminal and the third clock signal terminal, and the first-potential signal is supplied to all of the first clock signal terminal and the second clock signal terminal; and during the first output holding period, the second-potential signal is first supplied to the chamfering control signal terminal, and the first-potential signal is then supplied to the chamfering control signal terminal.

During the second output holding period, the second-potential signal is supplied to all of the input signal terminal, the reset signal terminal, the first clock signal terminal and the second clock signal terminal, and the first-potential signal is supplied to the third clock signal terminal; and during the second output holding period, the second-potential signal is first supplied to the chamfering control signal terminal, and the first-potential signal is then supplied to the chamfering control signal terminal.

Figure 7:
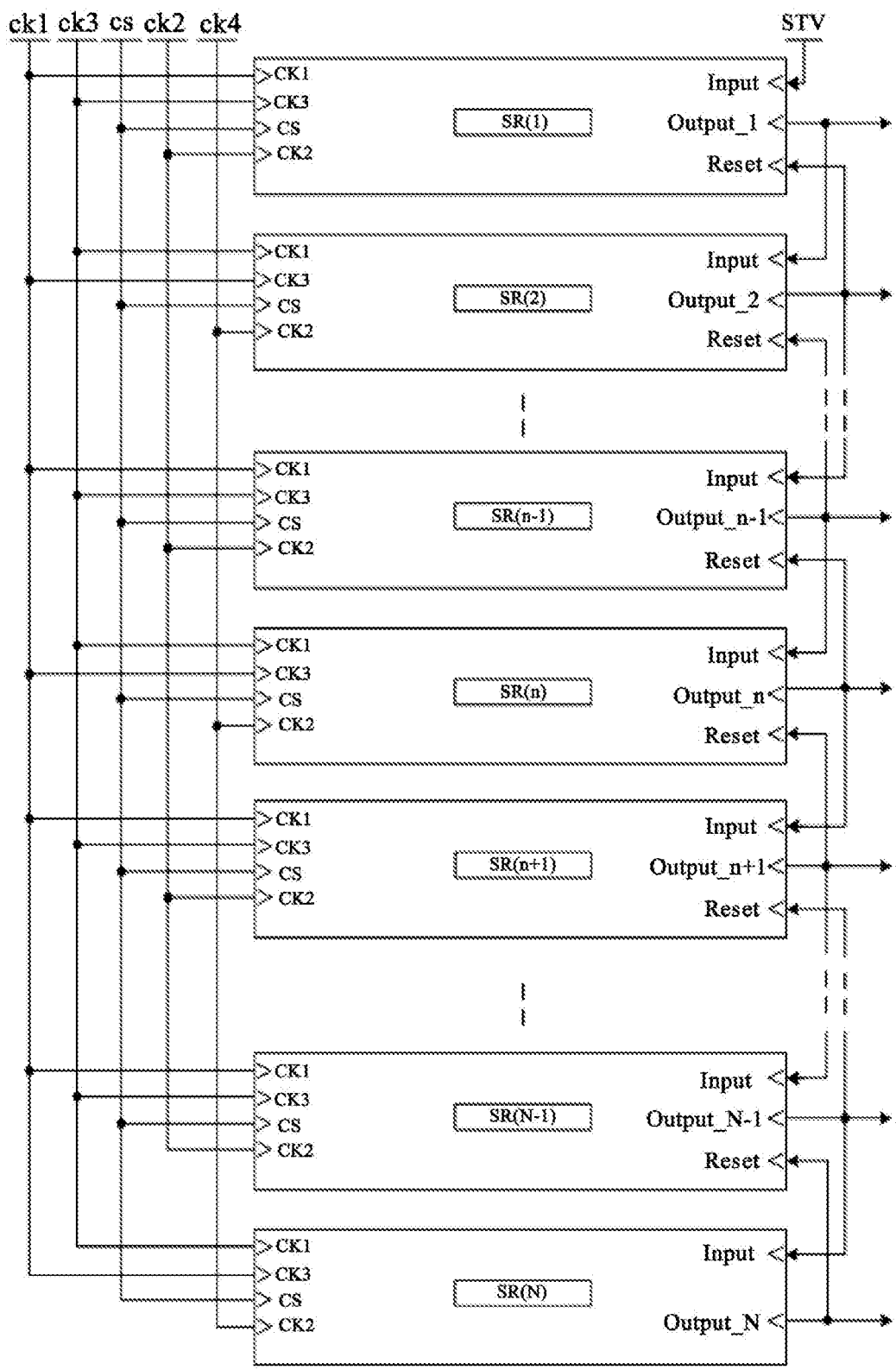
FIG. 7 is a structural schematic diagram of a gate driving circuit provided by an embodiment of the present disclosure.

Based on the same idea, an embodiment of the disclosure further provides a gate driving circuit, as shown in FIG. 7, including a plurality of shift registers SR (1), SR (2) . . . SR (n−1), SR (n), SR (n+1) . . . SR (N−1) and SR (N) (a total of N shift registers, 1≤n≤N), which are cascaded at respective stages, and the shift register is any one of the above shift registers provided by the embodiment of the disclosure.

The input signal terminal Input of the shift register at a first stage SR (1) is electrically connected to a frame trigger signal terminal STV.

The input signal terminal Input of the shift register at other stage SR (n) than the first stage SR (1) is electrically connected to the driving signal output terminal Output_n−1 of the shift register at a previous stage SR (n−1).

The reset signal terminal Reset of the shift register at other stage SR (n) than a last stage SR (N) is electrically connected to the driving signal output terminal Output_n+1 of the shift register at a next stage SR (n+1).

Specifically, the specific structure of each shift register of the above gate driving circuit is the same as that of any shift register provided by the above embodiment of the disclosure, which is not detailed described herein. As an example, the scanning signal Gate_n output by the shift register SR (n) in the above gate driving circuit provided by the embodiment of the disclosure is shown in FIG. 8, n=1, 2, . . . , N.

As an example, in the above gate driving circuit provided by the embodiment of the disclosure, the reference voltage signal terminals of the shift registers at all stages are electrically connected to a same reference signal control terminal.

As an example, in the above gate driving circuit provided by the embodiment of the disclosure, as shown in FIG. 7, both the first clock signal terminal CK1 of the shift register at the $(2k-1)^{th}$ stage and the third clock signal terminal CK3 of the shift register at the $(2k)^{th}$ stage are electrically connected to a same clock terminal, i.e. the first clock terminal ck1; and both the third clock signal terminal CK3 of the shift register at the $(2k-1)^{th}$ stage and the first clock signal terminal CK1 of the shift register at the $(2k)^{th}$ stage are electrically connected to a same clock terminal, i.e. the first clock terminal ck3. Furthermore, the second clock signal terminal CK2 of the shift register at the $(2k-1)^{th}$ stage is electrically connected to a same clock terminal, i.e. the second clock terminal ck2; and the second clock signal terminal CK2 of the shift register at the $(2k)^{th}$ stage is electrically connected to a same clock terminal, i.e. the fourth clock terminal ck4, and k is a positive integer.

Based on the same idea, an embodiment of the disclosure further provides a display device, including the above gate drive circuit provided by the disclosure. The gate driving circuit supplies a scanning signal with a chamfered waveform to all gate lines of the display panel in the display device respectively. The implementation of the above shift register may be referred to the specific implementation of the display device, which will not be described again. The display device may be any product or part with a display function such as a mobile phone, a tablet computer, a TV set, a display, a notebook computer, a digital photo frame and a navigator. Other essential components of the display device should be known by a person skilled in the art, and will not be described herein.

The shift register and the driving method thereof, the gate driving circuit and the display device provided by the embodiment of the disclosure includes the input component, the reset component, the node control component, the chamfering control component and the output component; and the input component is used to supply a signal at the input signal terminal to the first node under the control of the input signal terminal; the reset component is used to supply a signal at the reference voltage signal terminal to the first node under the control of the reset signal terminal; the node control component is used to make a potential of a signal at the first node opposite to a potential of a signal at the second node; the chamfering control component is used to supply a signal at the first clock signal terminal to the third node under the control of the first clock signal terminal, and supply a signal at the second clock signal terminal to the third node under the control of the chamfering control signal terminal, and an amplitude of the signal at the second clock signal terminal is smaller than that of the signal at the first clock signal terminal; and the output component is used to supply a signal at the third node to the driving signal output terminal of the shift register under the control of the signal at the first node and supply a signal at the reference voltage signal terminal to the driving signal output terminal under the control of the third clock signal terminal and the signal at the second node. By setting the chamfering control module and cooperation among the above five components, an amplitude of a scanning signal output by a driving signal output terminal is changed so as to generate a scanning signal with a chamfered waveform. When the scanning signal with the chamfered waveform is sequentially input to each pixel unit in a corresponding row by a corresponding gate line, a jump voltage $^\Delta Vp$ on a pixel electrode of the pixel unit can be reduced, thereby mitigating phenomena such as flashing and image sticking of the display panel and improving the display quality of the display panel.

It should be understood that, the foregoing embodiments are merely exemplary for explaining the principle of the application, but the application is not limited thereto. A person skilled in the art can make various variations and improvements without departing from the scope of the application, and these variations and improvements also fall within the protection scope of the application.

The invention claimed is:

1. A shift register, comprising an input component, a reset component, a node control component, a chamfering control component and an output component, wherein the input component is electrically connected to an input signal terminal and a first node, to supply a signal at the input signal terminal to the first node under the control of the input signal terminal;

the reset component is electrically connected to a reset signal terminal, a reference voltage signal terminal and the first node, to supply a signal at the reference voltage signal terminal to the first node under the control of the reset signal terminal;

the node control component is electrically connected to the first node and a second node, to make a potential of a signal at the first node opposite to a potential of a signal at the second node;

the chamfering control component is electrically connected to a first clock signal terminal, a second clock signal terminal, a chamfering control signal terminal and a third node, to supply a signal at the first clock signal terminal to the third node under the control of the first clock signal terminal, and supply a signal at the second clock signal terminal to the third node under the control of the chamfering control signal terminal, and an amplitude of the signal at the second clock signal terminal is smaller than that of the signal at the first clock signal terminal; and the output component is electrically connected to the first node, the second node, the third node, a third clock signal terminal and a driving signal output terminal, to supply a signal at the third node to the driving signal output terminal of the shift register under the control of the signal at the first node and supply a signal at the reference voltage signal terminal to the driving signal output terminal under the control of the third clock signal terminal and the signal at the second node.

2. The shift register of claim 1, wherein the chamfering control component comprises a first switching transistor and a second switching transistor;

a control electrode of the first switching transistor is electrically connected to the chamfering control signal terminal, a first electrode of the first switching transistor is electrically connected to the second clock signal terminal, and a second electrode of the first switching transistor is electrically connected to the third node; and both a control electrode and a first electrode of the second switching transistor are electrically connected to the first clock signal terminal, and a second electrode of the second switching transistor is electrically connected to the third node.

3. The shift register of claim 1, wherein the output component comprises a third switching transistor, a fourth switching transistor, a fifth switching transistor and a storage capacitor;

a control electrode of the third switching transistor is electrically connected to the first node, a first electrode of the third switching transistor is electrically connected to the third node, and a second electrode of the third switching transistor is electrically connected to the driving signal output terminal;

a control electrode of the fourth switching transistor is electrically connected to the second node, a first electrode of the fourth switching transistor is electrically connected to the reference voltage signal terminal, and a second electrode of the fourth switching transistor is electrically connected to the driving signal output terminal;

a control electrode of the fifth switching transistor is electrically connected to the third clock signal terminal, a first electrode of the fifth switching transistor is electrically connected to the reference voltage signal terminal, and a second electrode of the fifth switching transistor is electrically connected to the driving signal output terminal; and one terminal of the storage capacitor is electrically connected to the first node, and the other terminal of the storage capacitor is electrically connected to the driving signal output terminal.

4. The shift register of claim 2, wherein the output component comprises a third switching transistor, a fourth switching transistor, a fifth switching transistor and a storage capacitor;

a control electrode of the third switching transistor is electrically connected to the first node, a first electrode of the third switching transistor is electrically connected to the third node, and a second electrode of the third switching transistor is electrically connected to the driving signal output terminal;

a control electrode of the fourth switching transistor is electrically connected to the second node, a first electrode of the fourth switching transistor is electrically connected to the reference voltage signal terminal, and a second electrode of the fourth switching transistor is electrically connected to the driving signal output terminal;

a control electrode of the fifth switching transistor is electrically connected to the third clock signal terminal, a first electrode of the fifth switching transistor is electrically connected to the reference voltage signal terminal, and a second electrode of the fifth switching transistor is electrically connected to the driving signal output terminal; and one terminal of the storage capacitor is electrically connected to the first node, and the other terminal of the storage capacitor is electrically connected to the driving signal output terminal.

5. The shift register of claim 1, wherein the node control component comprises a first node control sub-component and a second node control sub-component;

the first node control sub-component is electrically connected to the reference voltage signal terminal, the first node and the second node, to supply the signal at the reference voltage signal terminal to the first node under the control of the signal at the second node; and the second node control sub-component is electrically connected to the third clock signal terminal, the reference voltage signal terminal, the first node and the second node, to supply a signal at the third clock signal terminal to the second node under the control of the third clock signal terminal, and supply the signal at the reference voltage signal terminal to the second node under the control of the signal at the first node.

6. The shift register of claim 4, wherein the node control component comprises a first node control sub-component and a second node control sub-component;

the first node control sub-component is electrically connected to the reference voltage signal terminal, the first node and the second node, to supply the signal at the reference voltage signal terminal to the first node under the control of the signal at the second node; and the second node control sub-component is electrically connected to the third clock signal terminal, the reference voltage signal terminal, the first node and the second node, to supply a signal at the third clock signal terminal to the second node under the control of the third clock signal terminal, and supply the signal at the reference voltage signal terminal to the second node under the control of the signal at the first node.

7. The shift register of claim 5, wherein the first node control sub-component comprises a sixth switching transistor; and a control electrode of the sixth switching transistor is electrically connected to the second node, a first electrode of the sixth switching transistor is electrically connected to the reference voltage signal terminal, and a second electrode of the sixth switching transistor is electrically connected to the first node.

8. The shift register of claim 5, wherein the second node control sub-component comprises a seventh switching transistor, a eighth switching transistor, a ninth switching transistor and a tenth switching transistor;

a control electrode and a first electrode of the seventh switching transistor are both electrically connected to the third clock signal terminal, and a second electrode of the seventh switching transistor is electrically connected to both a control electrode of the eighth switching transistor and a second electrode of the ninth switching transistor;

a first electrode of the eighth switching transistor is electrically connected to the third clock signal terminal, and a second electrode of the eighth switching transistor is electrically connected to the second node;

a control electrode of the ninth switching transistor is electrically connected to the first node, and a first electrode of the ninth switching transistor is electrically connected to the reference voltage signal terminal; and a control electrode of the tenth switch transistor is electrically connected to the first node, a first electrode of the tenth switching transistor is electrically connected to the reference voltage signal terminal, and a second electrode of the tenth switching transistor is electrically connected to the second node.

9. The shift register of claim 6, wherein the first node control sub-component comprises a sixth switching transistor; and a control electrode of the sixth switching transistor is electrically connected to the second node, a first electrode of the sixth switching transistor is electrically connected to the reference voltage signal terminal, and a second electrode of the sixth switching transistor is electrically connected to the first node.

10. The shift register of claim 9, wherein the second node control sub-component comprises a seventh switching transistor, an eighth switching transistor, a ninth switching transistor and a tenth switching transistor;

a control electrode and a first electrode of the seventh switching transistor are both electrically connected to the third clock signal terminal, and a second electrode of the seventh switching transistor is electrically connected to both a control electrode of the eighth switching transistor and a second electrode of the ninth switching transistor;

a first electrode of the eighth switching transistor is electrically connected to the third clock signal terminal, and a second electrode of the eighth switching transistor is electrically connected to the second node;

a control electrode of the ninth switching transistor is electrically connected to the first node, and a first electrode of the ninth switching transistor is electrically connected to the reference voltage signal terminal; and a control electrode of the tenth switch transistor is electrically connected to the first node, a first electrode of the tenth switching transistor is electrically connected to the reference voltage signal terminal, and a second electrode of the tenth switching transistor is electrically connected to the second node.

11. The shift register of claim 1, wherein the input component comprises an eleventh switching transistor; and a control electrode and a first electrode of the eleventh switching transistor are both electrically connected to the input signal terminal, and a second electrode of the eleventh switching transistor is electrically connected to the first node.

12. The shift register of claim 1, wherein the reset component comprises a twelfth switching transistor; and a control electrode of the twelfth switching transistor is electrically connected to the reset signal terminal, a first electrode of the twelfth switching transistor is electrically connected to the reference voltage signal terminal, and a second electrode of the twelfth switching transistor is electrically connected to the first node.

13. The shift register of claim 10, wherein the input component comprises an eleventh switching transistor;

a control electrode and a first electrode of the eleventh switching transistor are both electrically connected to the input signal terminal, and a second electrode of the eleventh switching transistor is electrically connected to the first node;

the reset component comprises a twelfth switching transistor; and a control electrode of the twelfth switching transistor is electrically connected to the reset signal terminal, a first electrode of the twelfth switching transistor is electrically connected to the reference voltage signal terminal, and a second electrode of the twelfth switching transistor is electrically connected to the first node.

14. The shift register of claim 1, further comprising a node stabilizing component; and the node stabilizing component is configured to supply the signal at the input signal terminal to the first node under the control of the third clock signal terminal.

15. The shift register of claim 14, wherein the node stabilizing component comprises a thirteenth switching transistor; and a control electrode of the thirteenth switching transistor is electrically connected to the third clock signal terminal, a first electrode of the thirteenth switching transistor is electrically connected to the input signal terminal, and a second electrode of the thirteenth switching transistor is electrically connected to the first node.

16. The shift register of claim 1, further comprising an output stabilizing component; and the output stabilizing component is configured to supply the signal at the reference voltage signal terminal to the driving signal output terminal under the control of the reset signal terminal.

17. The shift register of claim 16, wherein the output stabilizing component comprises a fourteenth switching transistor; and a control electrode of the fourteenth switching transistor is electrically connected to the reset signal terminal, a first electrode of the fourteenth switching transistor is electrically connected to the reference voltage signal terminal, and a second electrode of the fourteenth switching transistor is electrically connected to the driving signal output terminal.

18. A gate driving circuit, comprising a plurality of shift registers of claim 1, which are cascaded at respective stages, wherein the input signal terminal of the shift register at a first stage is electrically connected to a frame trigger signal terminal;

the input signal terminal of the shift register at other stage than the first stage is electrically connected to the driving signal output terminal of the shift register at a previous stage; and the reset signal terminal of the shift register at other stage than a last stage is electrically connected to the driving signal output terminal of the shift register at a next stage.

19. A display device, comprising the gate driving circuit of claim 18.

20. A driving method for the shift register of claim 1, comprising an input period, an input holding period, an output period, a chamfered waveform output period and a reset period; and during the input period, a first-potential signal is supplied to the input signal terminal and the third clock signal terminal, a second-potential signal is supplied to the reset signal terminal, the first clock signal terminal, the second clock signal terminal, and the chamfering control signal terminal, and the second-potential signal is output by the driving signal output terminal;

during the input holding period, the first-potential signal is supplied to the input signal terminal, the third clock signal terminal and the chamfering control signal terminal, the second-potential signal is supplied to the reset signal terminal, the first clock signal terminal and the second clock signal terminal, and the second-potential signal is output by the driving signal output terminal;

during the output period, the first-potential signal is supplied to the first clock signal terminal and the second clock signal terminal, the second-potential signal is supplied to the input signal terminal, the reset signal terminal, the third clock signal terminal and the chamfering control signal terminal, and the first-potential signal with a first amplitude is output by the driving signal output terminal;

during the chamfered waveform output period, the first-potential signal is supplied to the first clock signal terminal, the second clock signal terminal and the chamfering control signal terminal, the second-potential signal is supplied to the input signal terminal, the reset signal terminal and the third clock signal terminal, and the first-potential signal with a second amplitude is output by the driving signal output terminal;

during the reset period, the first-potential signal is supplied to the reset signal terminal and the third clock signal terminal, the second-potential signal is supplied to the input signal terminal, the first clock signal terminal, the second clock signal terminal and the chamfering control signal terminal, and the second-potential signal is output by the driving signal output terminal; and the first amplitude is different from the second amplitude.

* * * * *